(12) United States Patent
Sugimae et al.

(10) Patent No.: US 9,208,865 B2
(45) Date of Patent: Dec. 8, 2015

(54) RESISTANCE-CHANGE MEMORY

(71) Applicant: KABUSHIKI KAISHA TOSHIBA, Minato-ku, Tokyo (JP)

(72) Inventors: Kikuko Sugimae, Yokohama (JP); Reika Ichihara, Yokohama (JP); Tetsuya Hayashi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 294 days.

(21) Appl. No.: 13/839,611

(22) Filed: Mar. 15, 2013

(65) Prior Publication Data

US 2014/0071734 A1 Mar. 13, 2014

(30) Foreign Application Priority Data

Sep. 12, 2012 (JP) ................................ 2012-200892
Feb. 1, 2013 (JP) ................................ 2013-018645

(51) Int. Cl.
*G11C 11/00* (2006.01)
*G11C 13/00* (2006.01)

(52) U.S. Cl.
CPC .......... *G11C 13/0002* (2013.01); *G11C 13/004* (2013.01); *G11C 13/0007* (2013.01); *G11C 13/0011* (2013.01); *G11C 13/0069* (2013.01); *G11C 2213/77* (2013.01); *G11C 2213/79* (2013.01)

(58) Field of Classification Search
CPC ............. G11C 13/0069; G11C 13/004; G11C 13/0004; G11C 13/0007; G11C 13/0002; G11C 7/00; G11C 2013/0076; G11C 11/1673

USPC ......... 365/148, 46, 55, 74, 97, 100, 131, 158, 365/171, 173, 163
See application file for complete search history.

(56) References Cited

U.S. PATENT DOCUMENTS

| | | | |
|---|---|---|---|
| 7,978,479 B2 | 7/2011 | Liu et al. | |
| 2008/0205128 A1 | 8/2008 | Nakai | |
| 2009/0073753 A1 | 3/2009 | Osada et al. | |
| 2010/0091551 A1 | 4/2010 | Hosono et al. | |
| 2010/0165725 A1* | 7/2010 | Bedeschi | 365/163 |
| 2010/0238701 A1* | 9/2010 | Tsukamoto et al. | 365/148 |

(Continued)

FOREIGN PATENT DOCUMENTS

| | | |
|---|---|---|
| JP | 2007-004935 A | 1/2007 |
| WO | WO 2009/013819 A1 | 1/2009 |

OTHER PUBLICATIONS

Aratani et al, "A Novel Resistance Memory with High Scalability and Nanosecond Switching", Electron Devices Meeting, 2007. IEDM 2007. IEEE International.*

(Continued)

*Primary Examiner* — Fernando Hidalgo
(74) *Attorney, Agent, or Firm* — Holtz, Holtz, Goodman & Chick PC

(57) ABSTRACT

According to one embodiment, a resistance-change memory includes a memory cell and a control circuit. The memory cell includes a first electrode, a second electrode, and a variable resistance layer which is disposed between the first electrode and the second electrode. The control circuit sets a current flowing through the memory cell to a first upper limit and applies a first voltage to the memory cell in a first write, and after the first write, the control circuit sets the current flowing through the memory cell to a second upper limit and applies a second voltage to the memory cell in a second write.

20 Claims, 10 Drawing Sheets

(56) References Cited

U.S. PATENT DOCUMENTS

| | | |
|---|---|---|
| 2011/0038195 A1* | 2/2011 | Hamilton et al. ............ 365/148 |
| 2011/0176351 A1 | 7/2011 | Fujitsuka et al. |
| 2011/0188292 A1 | 8/2011 | Joo et al. |
| 2011/0205782 A1* | 8/2011 | Costa et al. .................. 365/148 |

OTHER PUBLICATIONS

Tabib-Azar, CuxS and Ag2S Solid-Electrochemical Cells as Non-Volatile Memory Devices, Electrochemical Society Proceedings vol. 2004-09, p. 42-56.*

Papandreou et al, "Programming Algorithms for Multilevel Phase-Change Memory," Proc. of IEEE International Symposium on Circuits and Systems (ISCAS'2011), Rio de Janeiro, Brazil, May 2011, pp. 329-332.*

Taiwanese Office Action (and English translation thereof) dated May 22, 2015, issued in counterpart Taiwanese Application No. 102107360.

Abe, et al., "Novel Cross Point Switch based on Zn1-xCdxS memory devices for FPGA", Device Research Conference, 2007 65th Annual Conference.

* cited by examiner

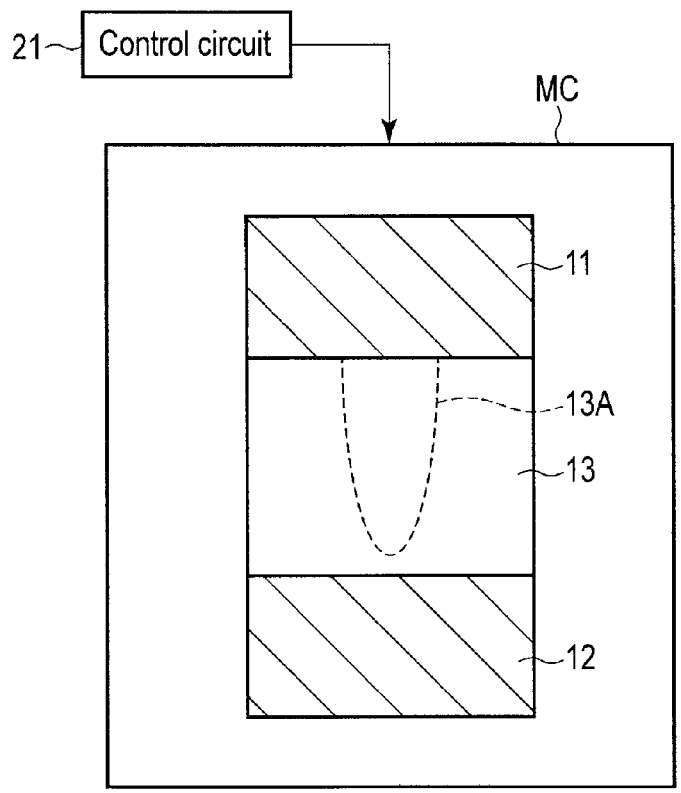
F I G. 3
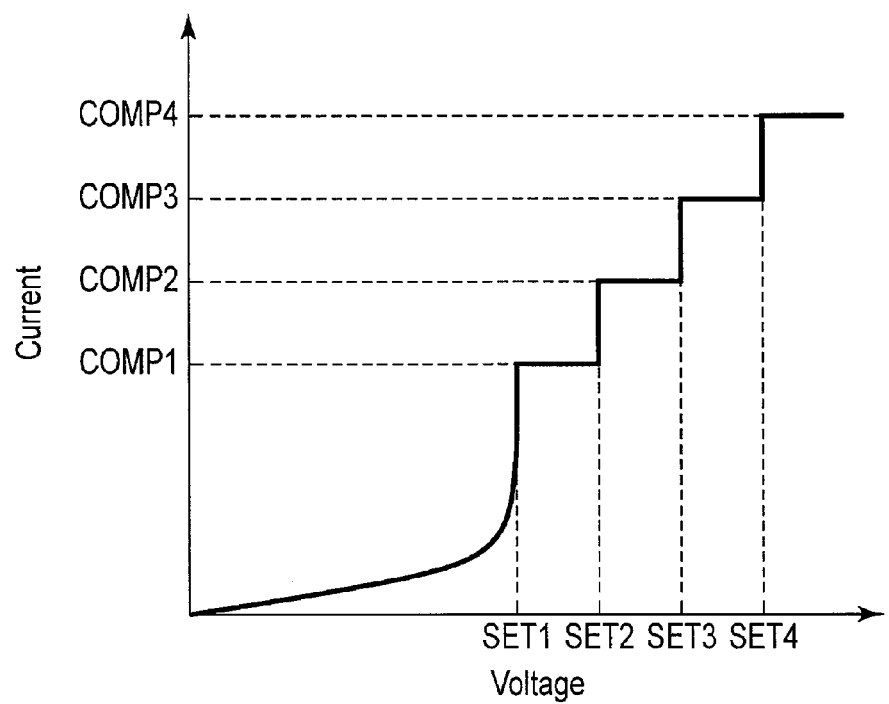
F I G. 4

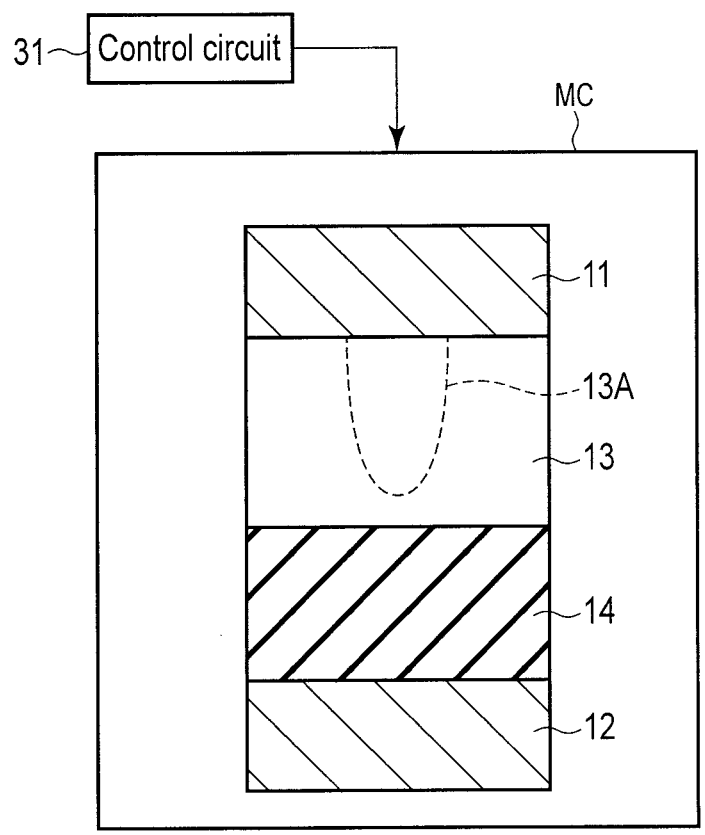
F I G. 16

RESISTANCE-CHANGE MEMORY

CROSS-REFERENCE TO RELATED APPLICATIONS

This application is based upon and claims the benefit of priority from Japanese Patent Applications No. 2012-200892, filed Sep. 12, 2012; and No. 2013-018645, filed Feb. 1, 2013, the entire contents of all of which are incorporated herein by reference.

FIELD

Embodiments described herein relate generally to a resistance-change memory.

BACKGROUND

In a resistance-change memory, a current is supplied and a voltage applied to a resistance-change element as a memory cell to change the resistance of the resistance-change element, and this change in resistance is used to store data in a non-volatile manner. The resistance-change memory is a two-terminal element and has a simple configuration. By forming a cross-point memory cell array configuration by using the resistance-change memory, the capacity of the resistance-change memory is easier to increase than it is with earlier configurations.

The resistance-change element includes a first electrode, a second electrode, and a variable resistance layer disposed between the first electrode and the second electrode. The variable resistance layer has a filament, and it is considered that the shape, for example, length and thickness of the filament vary in a high-resistance state or a low-resistance state.

BRIEF DESCRIPTION OF THE DRAWINGS

FIG. 1 is a circuit diagram showing a memory cell array in a resistance-change memory according to a first embodiment;

FIG. 2 is a circuit diagram showing another example of a memory cell array in the resistance-change memory according to the first embodiment;

FIG. 3 is a sectional view showing the configuration of a memory cell shown in FIG. 1;

FIG. 4 is a graph showing currents and voltages supplied to the memory cell during a write according to the first embodiment;

FIG. 5 is a graph showing voltage pulses applied to the memory cell during the write according to the first embodiment;

FIG. 6 is a graph showing another example of currents and voltages supplied to the memory cell during the write according to the first embodiment;

FIG. 7 is a circuit diagram showing the configuration of a current mirror circuit included in a sense amplifier according to the first embodiment;

FIG. 8 is a flowchart showing a write sequence according to the first embodiment;

FIG. 9 is a graph showing write voltages and limited currents in a write sequence of a first example according to the first embodiment;

FIG. 10 is a graph showing a modification of the write voltages and the limited currents in the write sequence of the first example according to the first embodiment;

FIG. 11 is a graph showing write voltages and limited currents in a write sequence of a second example according to the first embodiment;

FIG. 12 is a graph showing a modification of the write voltages and the limited currents in the write sequence of the second example according to the first embodiment;

FIG. 13 is a graph showing write voltages and limited currents in a write sequence of a third example according to the first embodiment;

FIG. 14 is a graph showing a modification of the write voltages and the limited currents in the write sequence of the third example according to the first embodiment;

FIG. 15 is a circuit diagram showing a memory cell array in a resistance-change memory according to a second embodiment; and FIG. 16 is a sectional view showing the configuration of a memory cell according to the second embodiment.

DETAILED DESCRIPTION

Hereinafter, a resistance-change memory according to the embodiments will be described with reference to the drawings. Components having the same functions and configurations are denoted by the reference signs in the description below, and are repeatedly described only when necessary.

In general, according to one embodiment, a resistance-change memory includes a memory cell and a control circuit. The memory cell includes a first electrode, a second electrode, and a variable resistance layer which is disposed between the first electrode and the second electrode and which is shifted between a high-resistance state and a low-resistance state lower in resistance than the high-resistance state. The control circuit applies a voltage across the first electrode and the second electrode and shifts the memory cell from the high-resistance state to the low-resistance state. The control circuit sets a current flowing through the memory cell to a first upper limit and applies a first voltage to the memory cell in a first write, and after the first write, the control circuit sets the current flowing through the memory cell to a second upper limit and applies a second voltage to the memory cell in a second write.

First Embodiment

A resistance-change memory according to the first embodiment is described. The resistance-change memory according to the first embodiment has, as a memory cell, a resistance-change element that varies in resistance. The resistance of the resistance-change element (for example, a dual-value resistance consisting of a high resistance [off] and a low resistance [on]) is programmed by a current and a voltage. Data is stored in the resistance-change memory in accordance with the resistance of the resistance-change element.

Here, a cross-point type resistance-change memory in which memory cells are arranged in matrix form at the intersections of word lines and bit lines is shown as an example.

[1] Memory Cell Array

FIG. 1 is a circuit diagram showing a memory cell array in the resistance-change memory according to the first embodiment.

As shown, the memory cell array forms a cross-point type. Word lines WL0, WL1, and WL2 extend in an X-direction, and are arranged at predetermined intervals in a Y-direction. A word line driver 21A is connected to word lines WL0, WL1, and WL2. Bit lines BL0, BL1, and BL2 extend in the Y-direction, and are arranged at predetermined intervals in the X-direction. Sense amplifiers (S/A) 21B are connected to bit lines BL0, BL1, and BL2, respectively.

Memory cells MC (0,0), (0,1), . . . , (2,2) are disposed at the intersections of word lines WL0, WL1, and WL2 and bit lines BL0, BL1, and BL2, respectively. Thus, the resistance-change memory has a cross-point type memory cell array configuration. Resistance-change elements described later are used for the memory cells MC.

Figure 1:
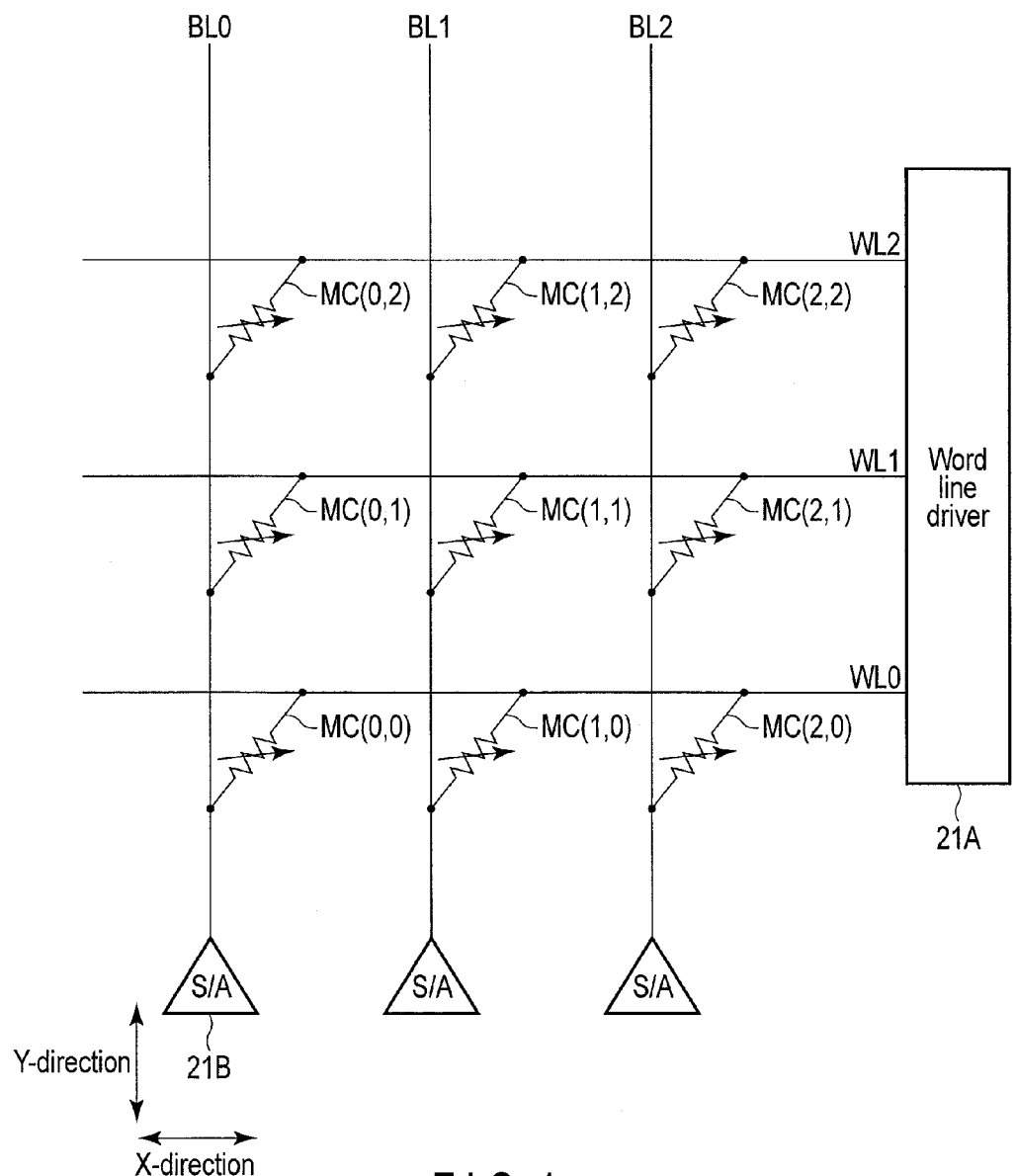
Figure 2:
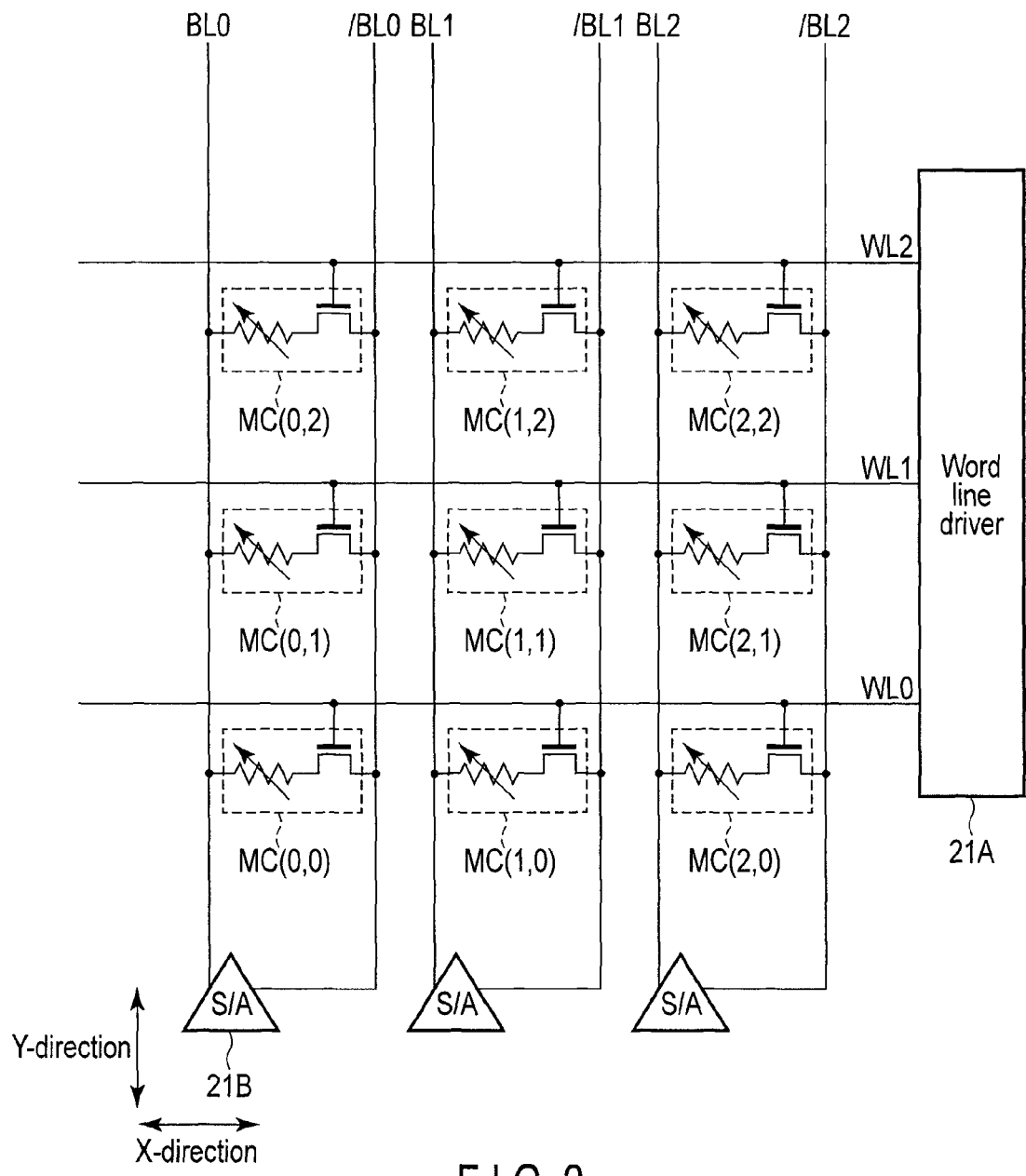

Although the resistance-change elements in only disposed at the intersections of the word lines and the bit lines in the example shown here, the resistance-change elements and selectors (for example, MOS transistors) may be configured to be disposed at the intersections of the word lines and the bit lines as shown in FIG. 2. It is also possible to use a stacked layer type memory cell array configuration in which the memory cell arrays shown in FIG. 1 or FIG. 2 are stacked.

[2] Resistance-Change Element

FIG. 3 is a view showing the configuration of the memory cell (resistance-change element) MC shown in FIG. 1.

The memory cell MC includes a first electrode 11, a second electrode 12, and a variable resistance layer 13 disposed between the first electrode 11 and the second electrode 12. The variable resistance layer 13 has a filament 13A formed between the first electrode 11 and the second electrode 12. The variable resistance layer 13 may have a single layer or a stacked layer structure (two or more layers).

The variable resistance layer 13 is shifted between a high-resistance state and a low-resistance state lower in resistance than the high-resistance state by at least one of a voltage and a current applied across the first electrode 11 and the second electrode 12. Transitioning the variable resistance layer 13 from the high-resistance state to the low-resistance state is called setting or writing.

Transitioning the variable resistance layer 13 from the low-resistance state to the high-resistance state is called resetting or erasing.

As shown, the filament 13A may extend from the first electrode 11, or may extend from the second electrode 12. The length and thickness of the filament 13A in the low-resistance state are at least greater than the length and thickness of the filament 13A in the high-resistance state.

A control circuit 21 supplies a current to and applies a voltage across the first electrode 11 and the second electrode 12 to write, erase, and read. Here, the word line driver 21A and the sense amplifiers 213 in FIG. 1 and FIG. 2 are shown as the control circuit 21.

Resistance-change elements made of the following materials can be used for the resistance-change element MC.

The variable resistance layer 13 can be changed in resistance by the application of a voltage, for example, by means of current, heat, or chemical energy. For example, a complex compound containing positive ions which serves as a transition element and which changes in resistance with the movement of the positive ions can be used as the variable resistance layer 13.

The following ion-conducting resistance-change elements can be used for the resistance-change element MC.

The first electrode 11 is made of a metal such as Ag, Co, Ni, Cu, Ti, Al, or Au that is easily ionized.

The second electrode (lower electrode) 12 is made of a metal such as TiN, W, Pt, Ta, or Mo that is not easily ionized, or made of an impurity-doped semiconductor layer such as p+ type silicon.

The variable resistance layer 13 is made of an ion-conducting material. The ion-conducting material containing a semiconductor includes, for example, amorphous silicon, hydrogenated amorphous silicon (a-Si:H), polycrystalline silicon (poly-Si), silicon oxide ($SiO_2$), silicon oxynitride (SiON), silicon nitride (SiN), silicon carbide (SiC), carbon-doped silicon oxide (SiOC), and germanium (Ge). Other ion-conducting materials include, for example, silver oxide ($Ag_2O$), silver sulfide ($Ag_2S$), silver selenide ($Ag_2Se$), silver telluride ($Ag_2Te$), silver iodide (AgI), copper iodide ($CuI_2$), copper oxide (CuO), copper sulfide (CuS), copper selenide (CuSe), copper telluride (CuTe), and germanium oxide ($GeO_2$). The variable resistance layer 13 may have a structure in which layers of a combination of the above materials are stacked. The above materials can be used without being limited to the specific composition ratio described here.

One of the first electrode 11 and the second electrode 12 functions as, for example, a lower electrode, and the other functions as an upper electrode. The lower electrode is an electrode serving as a foundation when the variable resistance layer 13 is formed. The upper electrode is an electrode formed after the variable resistance layer 13 is formed.

[3] Writing (Setting)

Writing to the resistance-change memory according to the first embodiment is described. In the write, the control circuit 21 applies the following write signal to the resistance-change element MC.

FIG. 4 is a graph showing currents and voltages supplied to the resistance-change element MC during the write.

As shown, first, an upper limit (hereinafter referred to as a limited current) of a current which flows through a selected resistance-change element MC is set to COMP1, and a voltage SET1 is applied to the resistance-change element MC to perform a first write. After the first write, the upper limit is set to a limited current COMP2, and a voltage SET2 is applied to perform a second write. If necessary, the upper limit is further set to a limited current COMP3 after the second write, and a voltage SET3 is applied to perform a third write. If necessary, the upper limit may be further set to a limited current COMP4 after the third write, and a voltage SET4 may be applied to perform a fourth write.

Limited current COMP2 is higher than limited current COMP1, and limited current COMP3 is higher than limited current COMP2. Limited current COMP4 is higher than limited current COMP3. Limited current COMP4 is, for example, 1 µA or less. Voltage SET1 is 15 V or less, for example, 3 to 8 V. Voltage SET2 is 0.1 to 0.9 V higher than voltage SET1. Voltage SET3 is 0.1 to 0.9 V higher than voltage SET2. Voltage SET4 is 0.1 to 0.9 V higher than voltage SET3.

Thus, the upper limit of the current flowing through the resistance-change element MC is limited to limited current COMP1, and the first write is performed with voltage SET1. After the first write, the upper limit is limited to limited current COMP2, which is higher than limited current COMP1, and the second write is performed with voltage SET2, which is higher than voltage SET1. As a result, variation in the shape of the filaments 13A is inhibited, and the filaments can have uniform shape. This is attributed to the fact that the shape of the filament 13A is considered to be correlated with a maximum current during setting (writing). It goes without saying that after the second write, the upper limit of the current may be limited to limited current COMP3, and the third write may be performed with voltage SET3. The upper limit of the current may then be limited to limited current COMP4, and the fourth write may be performed with voltage SET4.

That is, writing in which the upper limit of the current is limited is performed with first and second voltages or with first, second, and third voltages or by more step voltages. Consequently, variation in shape, for example, the width and height of the filaments 13A formed in the resistance-change elements MC, is inhibited, and the filaments can have uniform shape.

Figure 5:
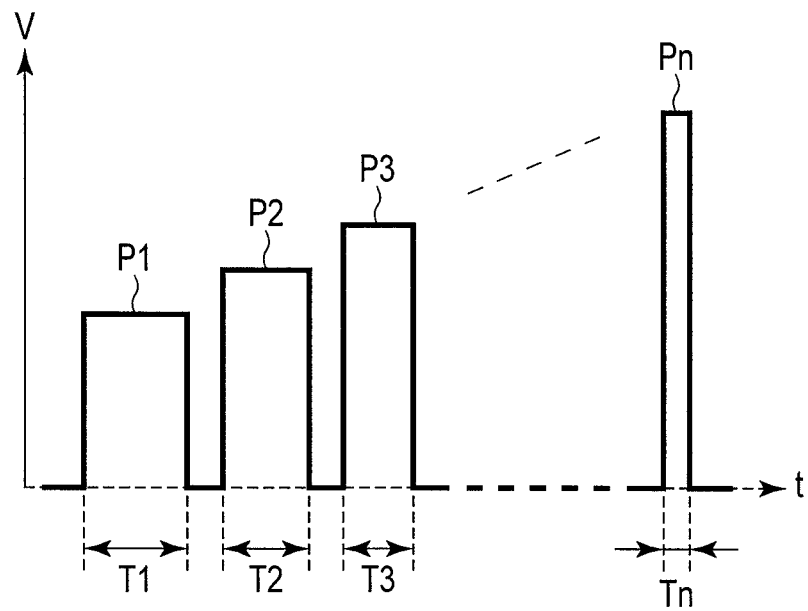

Now, the write performed by the application of voltage pulses shown in FIG. 5 is described.

FIG. 5 is a graph showing the voltage pulses applied to the resistance-change element MC during the write.

As shown, a voltage pulse P1 is applied to the selected resistance-change element MC to perform the first write. Voltage pulse P1 is 15 V or less, for example, 3 to 8 V. Pulse width T1 of voltage pulse P1 is, for example, several microseconds or less.

After the first write, a voltage pulse P2 is applied to perform the second write. Voltage pulse P2 is, for example, about several tens of millivolts higher than voltage pulse P1. Pulse width T2 of voltage pulse P2 is less than pulse width T1.

If necessary, after the second write, a voltage pulse P3 is applied to perform the third write. Voltage pulse P3 is, for example, about several tens of millivolts higher than voltage pulse P2. Pulse width T3 of voltage pulse P3 is less than pulse width T2.

Thus, after the $(n-1)^{th}$ write, a voltage pulse Pn is applied to perform the $n^{th}$ write. Voltage pulse Pn is, for example, about several tens of millivolts higher than voltage pulse P(n−1). Pulse width Tn of voltage pulse Pn is less than pulse width T(n−1). Here, n is a natural number greater than or equal to 2.

Thus, voltage pulses which are higher and narrower than the previously applied voltage pulses are sequentially applied to the resistance-change element MC. As a result, variation in shape, for example, the width and height of the filaments formed in the resistance-change elements MC, is inhibited, and the filaments can have uniform shape. This is attributed to the fact that rapid growth of the filament 13A can be inhibited by the reduction of pulse time.

Figure 6:
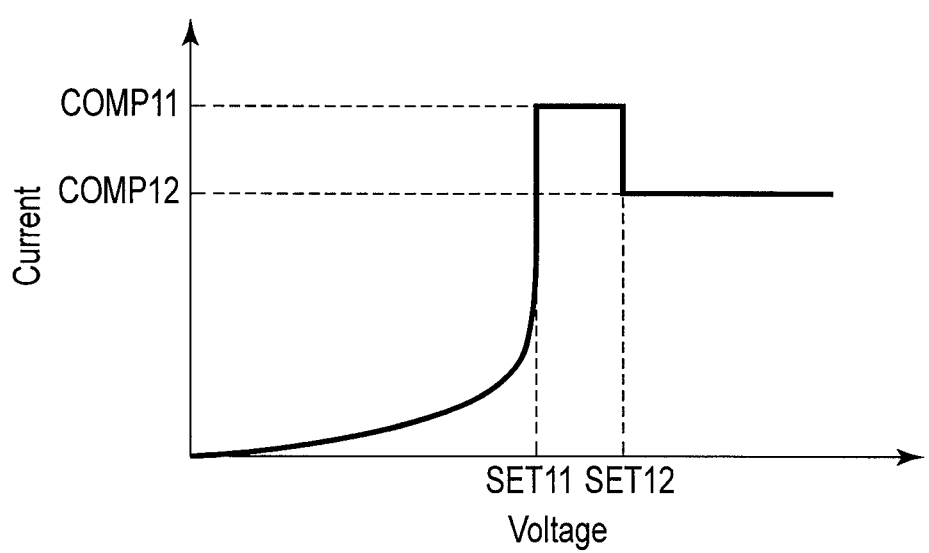

Writing can also be performed by a write signal shown in FIG. 6.

FIG. 6 is a graph showing another example of currents and voltages supplied to the resistance-change element MC during the write.

As shown, first, a current which flows through a selected resistance-change element MC is set to a limited current COMP11, and a voltage SET11 is applied to the resistance-change element MC to perform a first write. After the first write, the upper limit is set to a limited current COMP12, which is lower than limited current COMP11, and a voltage SET12 is applied to perform a second write. Voltage SET12 is, for example, 0.1 to 0.9 V higher than voltage SET11. Voltage SET12 may be, for example, 0.1 to 0.9 V lower than voltage SET11.

Thus, in the second write, voltage SET12 is higher than voltage SET11, and current COMP12 is lower than current COMP11. It is therefore considered that the shape of the filament 13A is determined by current COMP12. As a result, variation in shape, for example, the width and height of the filaments 13A formed in the resistance-change elements MC, is inhibited, and the filaments can have uniform shape.

[4] Write Circuit

Now, a current limiting circuit, for example, a current mirror circuit provided in the sense amplifier 21B of the control circuit 21 to limit the current flowing through the resistance-change element MC is described. Although the use of the current mirror circuit as the current limiting circuit is described by way of example, other current limiting circuits may be used instead. Here, the circuit for supplying the write signal shown in FIG. 4 is shown.

Figure 7:
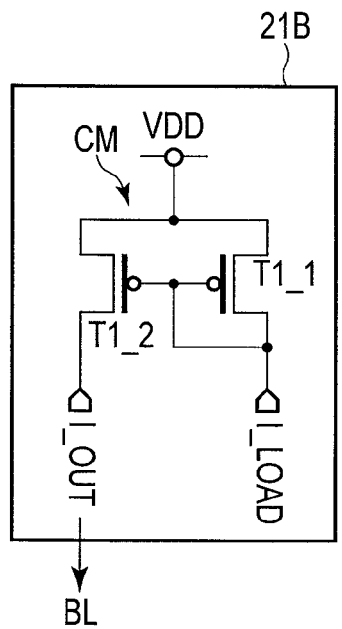

FIG. 7 is a circuit diagram showing the configuration of the current mirror circuit included in the sense amplifier 21B according to the first embodiment.

As shown, the sense amplifier 21B includes a current mirror circuit CM. The current mirror circuit CM has MOS transistors T1_1 and T1_2. A power supply voltage VDD is supplied to one end of the current path of each of MOS transistors T1_1 and T1_2. A load current I_LOAD flows through the other end of the current path of transistor T1_1. At the same time, a current I_OUT corresponding to the load current I_LOAD flows through the other end of the current path of transistor T1_2. This current I_OUT is supplied to the resistance-change element MC via the bit line BL.

The control circuit 21 controls the current mirror circuit CM to set the current I_OUT to be supplied to the resistance-change element MC to one of limited currents COMP1, COMP2, COMP3, and COMP4. That is, the current mirror circuit CM outputs the upper limit of the current to be passed through the resistance-change element MC, i.e., one of limited currents COMP1, COMP2, COMP3, and COMP4 in accordance with the load current I_LOAD controlled by the control circuit 21. Thus, the upper limit of the current (limited current) to be supplied to the resistance-change element MC can be changed.

[5] Advantageous Effects

The cross-point type memory cell array has the following general problems. In a plurality of memory cells MC within the memory cell array, the filaments 13A formed in the variable resistance layers 13 are varied in shape when the memory cells MC transition from the high-resistance state to the low-resistance state. As a result, the currents flowing through the memory cells MC in the low-resistance state are varied.

In the present embodiment, a voltage with a limited current is applied to the memory cells MC two or more times. As a result, variation in the shape of the filaments 13A formed in the variable resistance layers 13 is inhibited, and the filaments 13A can have uniform shape. This can reduce variation in the currents flowing through the memory cells in the low-resistance state (or on-state). That is, writing is performed two or more times by a voltage with a current limitation, so that variation in the width of the filaments formed in the resistance-change elements MC is reduced, and the filaments have uniform shape. Consequently, in the cross-point type memory cell array, variation in the currents flowing through the memory cells in the low-resistance state can be reduced.

It is also possible to reduce an extra current flowing through the selected word line or bit line and prevent damage to the selected word line or bit line.

As described above, according to the present embodiment, it is possible to provide a resistance-change memory in which the filaments formed in the variable resistance layers of the memory cells in the low-resistance state can have uniform shape and in which variation in the resistance of the memory cells in the low-resistance state can be reduced.

[6] Write (Set) Sequence

A write sequence in the resistance-change memory according to the first embodiment is described.

Figure 8:
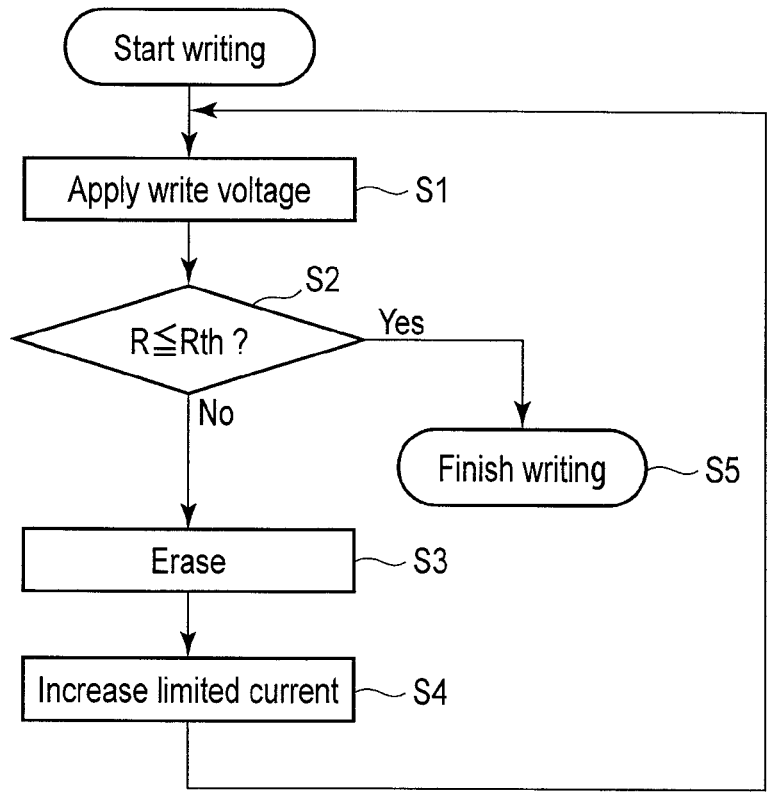

FIG. 8 is a flowchart showing the write sequence according to the first embodiment. FIG. 9 to FIG. 14 are graphs showing write voltages and limited currents in write sequences of first to third examples and a read voltage in write verification. Here, the limited current is the upper limit of the current flowing through the bit line connected to the aforementioned sense amplifier 21B.

Figure 9:
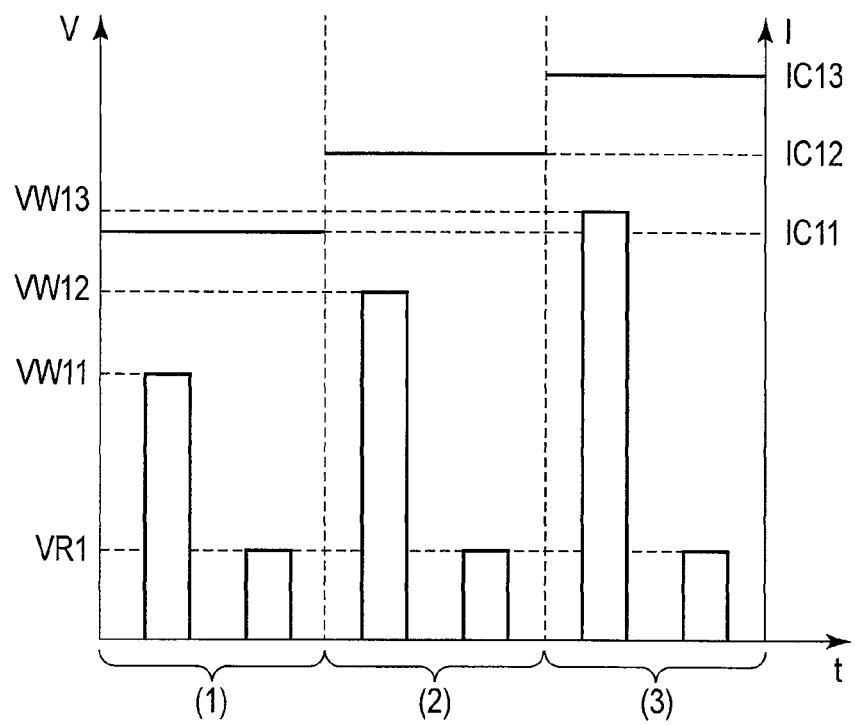

As shown in FIG. 8 and FIG. 9, the control circuit 21 first writes to (sets) a selected memory cell MC. In this write, a write voltage (set pulse) VW11 is applied to the memory cell MC, and the upper limit of the current flowing through the bit line connected to the memory cell MC is set to a limited current IC11 (step S1).

The control circuit 21 verifies the memory cell MC which has been written to. In the verification, a read voltage VR1 is applied to the memory cell MC, and the memory cell MC is read. The resistance R of the memory cell MC which has been written to is ascertained by the read, and whether the resistance R is less than or equal to a desired resistance Rth is determined (step S2).

If the resistance R is greater than Rth in step S2, the control circuit 21 erases (resets) the memory cell MC (step S3).

The control circuit 21 then again writes to (sets) the selected memory cell MC. In this write, the upper limit of the current flowing through the bit line connected to the memory cell MC is set to a limited current IC12 (step S4), and a write voltage VW12 is applied to the memory cell MC (step S1). Limited current IC12, which is the upper limit of the current, is higher than limited current IC11. Write voltage VW12 is higher than write voltage VW11.

That is, if the resistance R of the memory cell MC is greater than the desired resistance Rth, the memory cell MC is temporarily erased (reset), and then the limit of the current is raised; that is, the limit is set to limited current IC12 having a higher upper limit than limited current IC11 to again write (set).

The control circuit 21 repeats the operations of steps S1 to S4, and finishes the write (set) once the resistance R has become less than the desired resistance Rth (step S5).

Now, the write voltage and its limited current in the write sequence of a first example are described with reference to FIG. 9.

FIG. 9 shows the write voltages and the limited currents in the write sequence of the first example and a read voltage in write verification. The first time period (1) in FIG. 9 shows a write voltage VW11 applied in the first write and its limited current IC11, and a read voltage VR1 in the write verification. The second time period (2) in FIG. 9 shows a write voltage VW12 applied in the second write and its limited current IC12, and the read voltage VR1 in the write verification. The third time period (3) in FIG. 9 shows a write voltage VW13 applied in the third write and its limited current IC13, and the read voltage VR1 in the write verification.

Initially, in the first write, the write voltage is set to voltage VW11, and the upper limit of the current is set to limited current IC11. Write voltage VW11 is then applied to the memory cell MC, and the read voltage VR1 is applied in the subsequent verification. If it is determined by the verification read that the resistance R is greater than Rth, an erase (reset) is performed, and then the second write is performed.

In the second write, the write voltage is set to voltage VW12, which is higher than voltage VW11, and the upper limit of the current is set to limited current IC12, which is higher than limited current IC11. Write voltage VW12 is then applied to the memory cell MC, and the read voltage VR1 is applied in the subsequent verification. If it is determined by the verification read that the resistance R is greater than Rth, an erase is performed, and then the third write is performed.

In the third write, the write voltage is set to voltage VW13, which is higher than voltage VW12, and the upper limit of the current is set to limited current IC13, which is higher than limited current IC12. Write voltage VW13 is then applied to the memory cell MC, and the read voltage VR1 is applied in the subsequent verification. For example, if it is determined by the verification read that the resistance R is less than or equal to Rth, the write is complete. Conversely, if it is determined by the verification read that the resistance R is greater than Rth, an erase is performed, and then the fourth write is performed. Although not shown in FIG. 9, the fourth write is performed with write voltages and limited currents that are higher than those in the third write.

It is considered that the shape of the filament 13A is correlated with a maximum current during setting (writing). Therefore, if writing is performed with the changing upper limit of the current, variation in shape, for example, the width and height of the filaments 13A formed in the resistance-change elements MC, is inhibited, and the filaments can have uniform shape.

In this sequence, if the resistance of the memory cell after writing is higher than a desired resistance, the memory cell is erased (reset), and then a higher upper limit of the limited current is set to again write. As a result, variation in the resistance of the selected memory cell after writing can be reduced.

Figure 10:
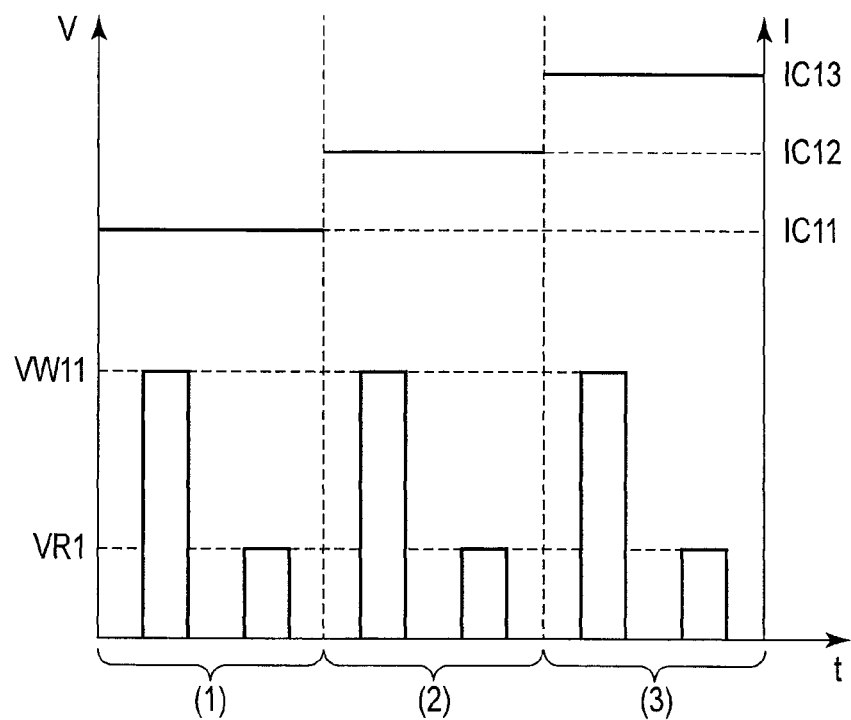

Although both the write voltage and the limited current set during the write shown in FIG. 9 are increased with every increase in the number of writes, this is not a limitation. As shown in FIG. 10, write voltage VW11 may be constant, and the limited current alone may be increased with every increase in the number of writes. It is considered that if write voltage VW11 is sufficiently high, the shape of the filament 13A is determined by the maximum current during setting (writing). Therefore, even if write voltage VW11 is constant, the resistance distribution of the memory cell is reduced to a greater degree by the increase in the upper limit of the limited current.

Now, the write voltage and its limited current in the write sequence of a second example are described with reference to FIG. 11.

Figure 11:
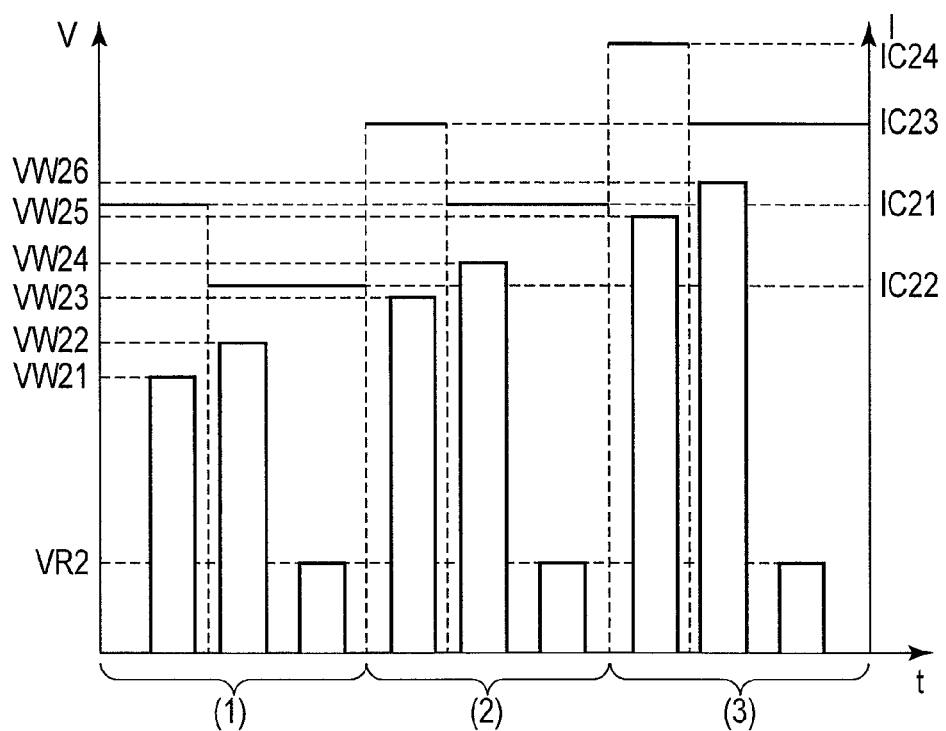

FIG. 11 shows the write voltages and the limited currents in the write sequence of the second example and a read voltage in write verification. The first time period (1) in FIG. 11 shows write voltages VW21 and VW22 consecutively applied in the first write and their limited currents IC21 and IC22, and a read voltage VR2 in the write verification. The second time period (2) in FIG. 11 shows write voltages VW23 and VW24 consecutively applied in the second write and their limited currents IC23 and IC21, and the read voltage VR2 in the write verification. The third time period (3) in FIG. 11 shows write voltages VW25 and VW26 consecutively applied in the third write and their limited currents IC24 and IC23, and the read voltage VR2 in the write verification.

Initially, in the first write, the write voltage is set to voltage VW21, and the upper limit of the current is set to limited current IC21. Write voltage VW21 is then applied to the memory cell MC. The write voltage is then set to voltage VW22, which is higher than voltage VW21, and the upper limit of the current is set to limited current IC22, which is lower than limited current IC21. Write voltage VW22 is then applied to the memory cell MC. The read voltage VR2 is applied in the subsequent verification. If it is determined by the verification read that the resistance R is greater than the desired resistance Rth, an erase (reset) is performed, and then the second write is performed.

In the second write, the write voltage is set to voltage VW23, which is higher than voltage VW22, and the upper limit of the current is set to limited current IC23, which is higher than limited current IC21. Write voltage VW23 is then applied to the memory cell MC. The write voltage is then set to voltage VW24, which is higher than voltage VW23, and the upper limit of the current is set to limited current IC21, which is lower than limited current IC23. Write voltage VW24 is then applied to the memory cell MC. The read voltage VR2 is applied in the subsequent verification. If it is determined by the verification read that the resistance R is greater than Rth, an erase is performed, and then the third write is performed.

In the third write, the write voltage is set to voltage VW25, which is higher than voltage VW24, and the upper limit of the current is set to limited current IC24, which is higher than limited current IC23. Write voltage VW25 is then applied to the memory cell MC. The write voltage is then set to voltage VW26, which is higher than voltage VW25, and the upper limit of the current is set to current IC23, which is lower than current IC24. Write voltage VW26 is then applied to the memory cell MC. The read voltage VR2 is applied in the subsequent verification. For example, if it is determined by the verification read that the resistance R is less than or equal to the resistance Rth, the write is complete. Conversely, if it is determined by the verification read that the resistance R is greater than the resistance Rth, an erase is performed, and then the fourth write is performed. Although not shown in FIG. 11, the fourth write is performed with a write voltage higher than that in the third write and with increased and decreased limited current.

Again in the sequence shown in FIG. 11, variation in the resistance of the selected memory cell after writing can be reduced. It is considered that the shape of the filament 13A is mainly determined by limited current IC22, for example, because voltage VW22 is higher than voltage VW21 and current IC22 is lower than current IC21. As a result, variation in shape, for example, the width and height of the filaments 13A formed in the resistance-change elements MC, is inhibited, and the filaments can have uniform shape.

Figure 12:
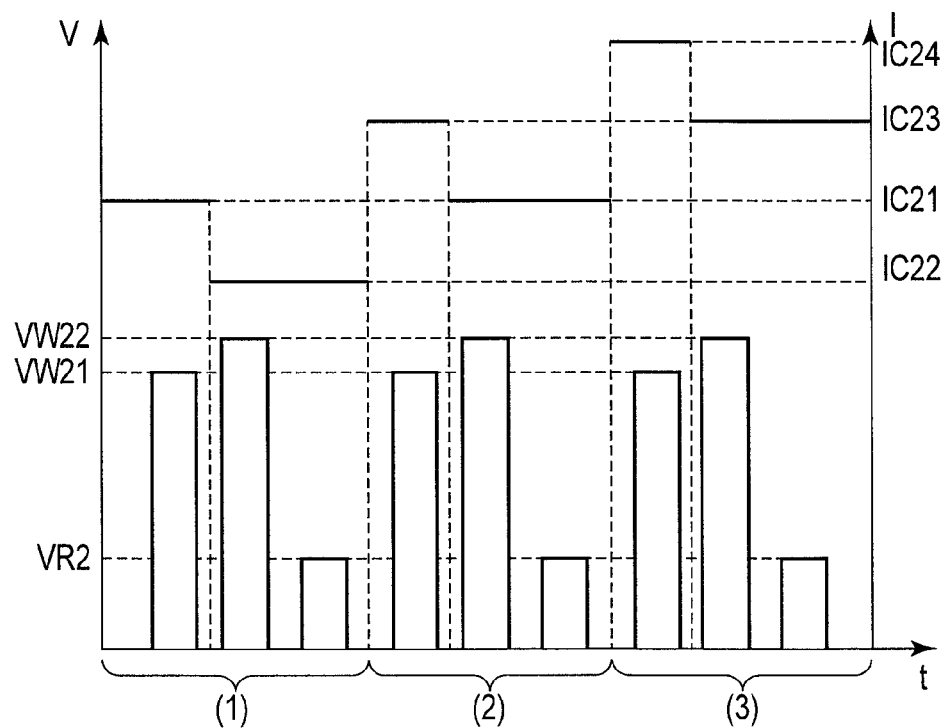

In the case of the write voltage and the limited current set during the write shown in FIG. 11, the write voltage is increased and the limited current is increased and decreased with every increase in the number of writes. However, this is not a limitation. As shown in FIG. 12, write voltages VW21 and VW22 may be constant, and the limited currents alone may be increased and decreased with every increase in the number of writes. As in FIG. 10, it is considered that if write voltages VW21 and VW22 are sufficiently high, the shape of the filament 13A is determined by the maximum current during setting (writing). Therefore, even if write voltages VW21 and VW22 are constant, the resistance distribution of the memory cell is decreased to a greater degree by the increase in the upper limit of the limited current.

Now, the write voltage and its limited current in the write sequence of a third example are described with reference to FIG. 13.

Figure 13:
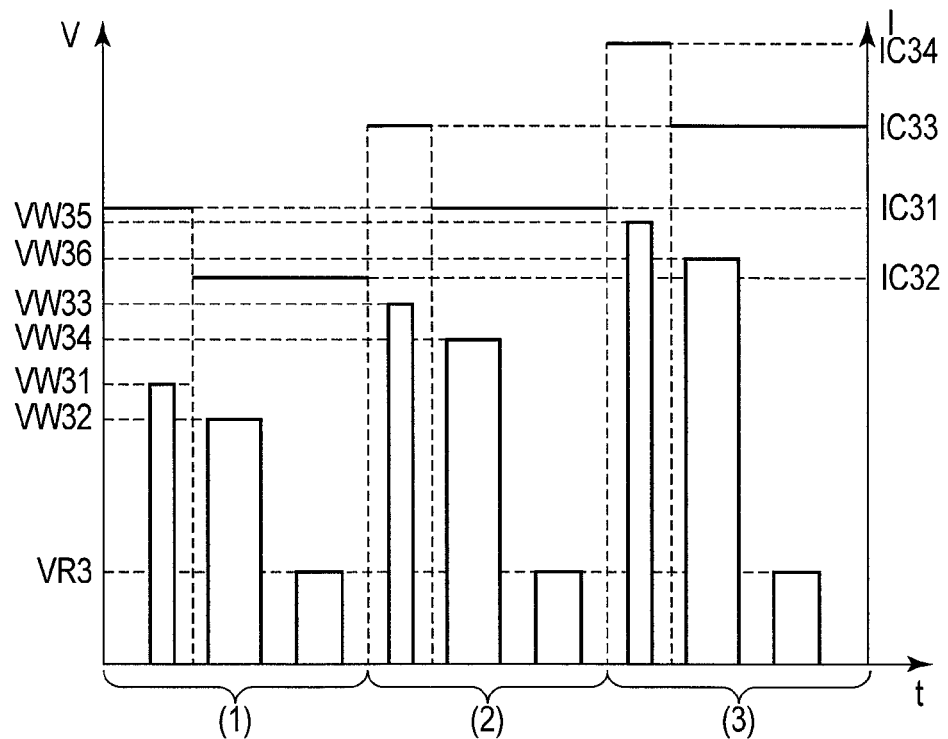

FIG. 13 shows the write voltages and the limited currents in the write sequence of the third example and a read voltage in write verification. The first time period (1) in FIG. 13 shows write voltages VW31 and VW32 consecutively applied in the first write and their limited currents IC31 and IC32, and a read voltage VR3 in the write verification. The second time period (2) in FIG. 13 shows write voltages VW33 and VW34 consecutively applied in the second write and their limited currents IC33 and IC31, and the read voltage VR3 in the write verification. The third time period (3) in FIG. 13 shows write voltages VW35 and VW36 consecutively applied in the third write and their limited currents IC34 and IC33, and the read voltage VR3 in the write verification.

Initially, in the first write, the write voltage is set to voltage VW31, and the upper limit of the current is set to limited current IC31. Write voltage VW31 is then applied to the memory cell MC. The write voltage is then set to voltage VW32, and the upper limit of the current is set to limited current IC32, which is lower than limited current IC31. Write voltage VW32 is then applied to the memory cell MC. For example, the application time (pulse width) of write voltage VW31 is several nanoseconds, and the application time (pulse width) of write voltage VW32 is several microseconds. The read voltage VR3 is applied in the subsequent verification. If it is determined by the verification read that the resistance R is greater than the desired resistance Rth, the memory cell MC is erased (reset), and then the second write is performed.

In the second write, the write voltage is set to voltage VW33, which is higher than voltage VW31, and the upper limit of the current is set to limited current IC33, which is higher than limited current IC31. Write voltage VW33 is then applied to the memory cell MC. The write voltage is then set to voltage VW34, which is lower than voltage VW33, and the upper limit of the current is set to current IC31, which is lower than limited current IC33. Write voltage VW34 is then applied to the memory cell MC. For example, the application time (pulse width) of write voltage VW33 is several nanoseconds, and the application time (pulse width) of write voltage VW34 is several microseconds. The read voltage VR3 is applied in the subsequent verification. If it is determined by the verification read that the resistance R is greater than Rth, the memory cell MC is erased, and then the third write is performed.

In the third write, the write voltage is set to voltage VW35, which is higher than voltage VW33, and the upper limit of the current is set to limited current IC34, which is higher than limited current IC33. Write voltage VW35 is then applied to the memory cell MC. The write voltage is then set to voltage VW36, which is higher than voltage VW35, and the upper limit of the current is set to limited current IC33, which is lower than limited current IC34. Write voltage VW36 is then applied to the memory cell MC. For example, the application time (pulse width) of write voltage VW35 is several nanoseconds, and the application time (pulse width) of write voltage VW36 is several microseconds. The read voltage VR3 is applied in the subsequent verification. For example, if it is determined by the verification read that the resistance R is less than or equal to Rth, the write is complete. Conversely, if it is determined by the verification read that the resistance R is greater than Rth, an erase is performed, and then the fourth write is performed. Although not shown in FIG. 13, the fourth write is performed with a write voltage higher than that in the third write and with increased and decreased limited current.

Again in the sequence shown in FIG. 13, variation in the resistance of the selected memory cell after writing can be reduced. It is considered that the shape of the filament 13A is mainly determined by limited current IC32, for example, because voltage VW32 is a pulse lower and wider than voltage VW31 and current IC32 is lower than current IC31. As a result, variation in shape, for example, the width and height of the filaments 13A formed in the resistance-change elements MC, is inhibited, and the filaments can have uniform shape.

Figure 14:
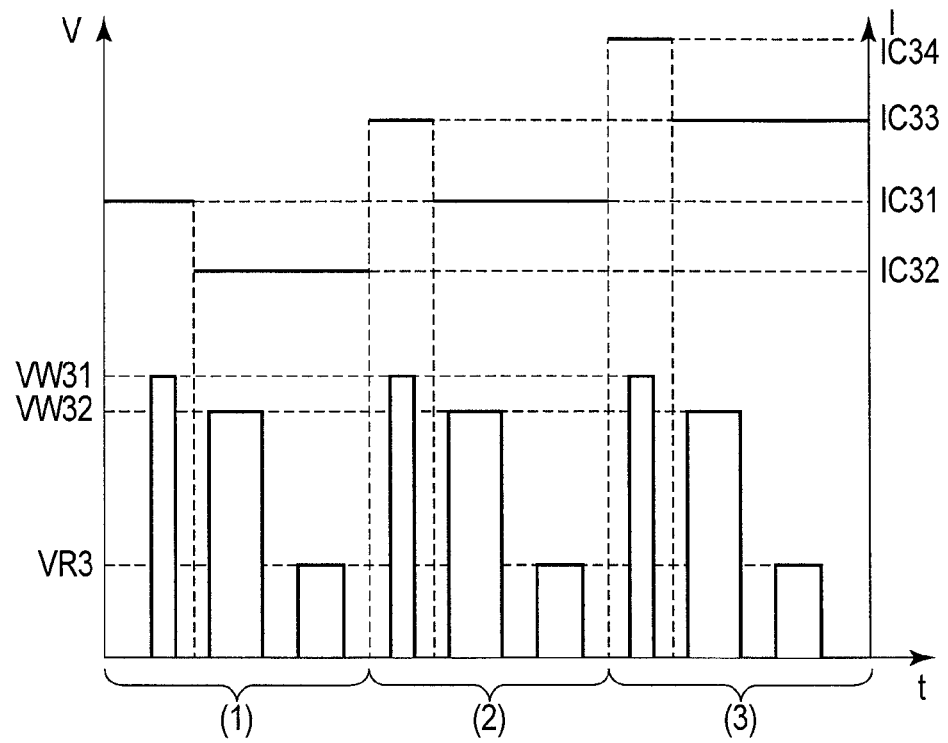

In the case of the write voltage and the limited current set during the write shown in FIG. 13, the write voltage is increased with every increase in the number of writes. However, this is not a limitation. As shown in FIG. 14, write voltages VW31 and VW32 may be constant, and the limited currents alone may be increased and decreased with every increase in the number of writes. As in FIG. 10, it is considered that if write voltages VW31 and VW32 are sufficiently high, the shape of the filament 13A is determined by the maximum current during setting (writing). Therefore, even if write voltages VW31 and VW32 are constant, the resistance distribution of the memory cell is reduced to a greater degree by the increase in the upper limit of the limited current.

Second Embodiment

In the first embodiment described above, the resistance-change element (or the resistance-change element and the selector) is provided as the memory cell. In the example described according to the second embodiment, a resistance-change element and a protection resistive element are provided as a memory cell. Here, a cross-point type resistance-change memory in which memory cells are arranged in matrix form at the intersections of word lines and bit lines is shown as an example.

[1] Memory Cell Array

Figure 15:
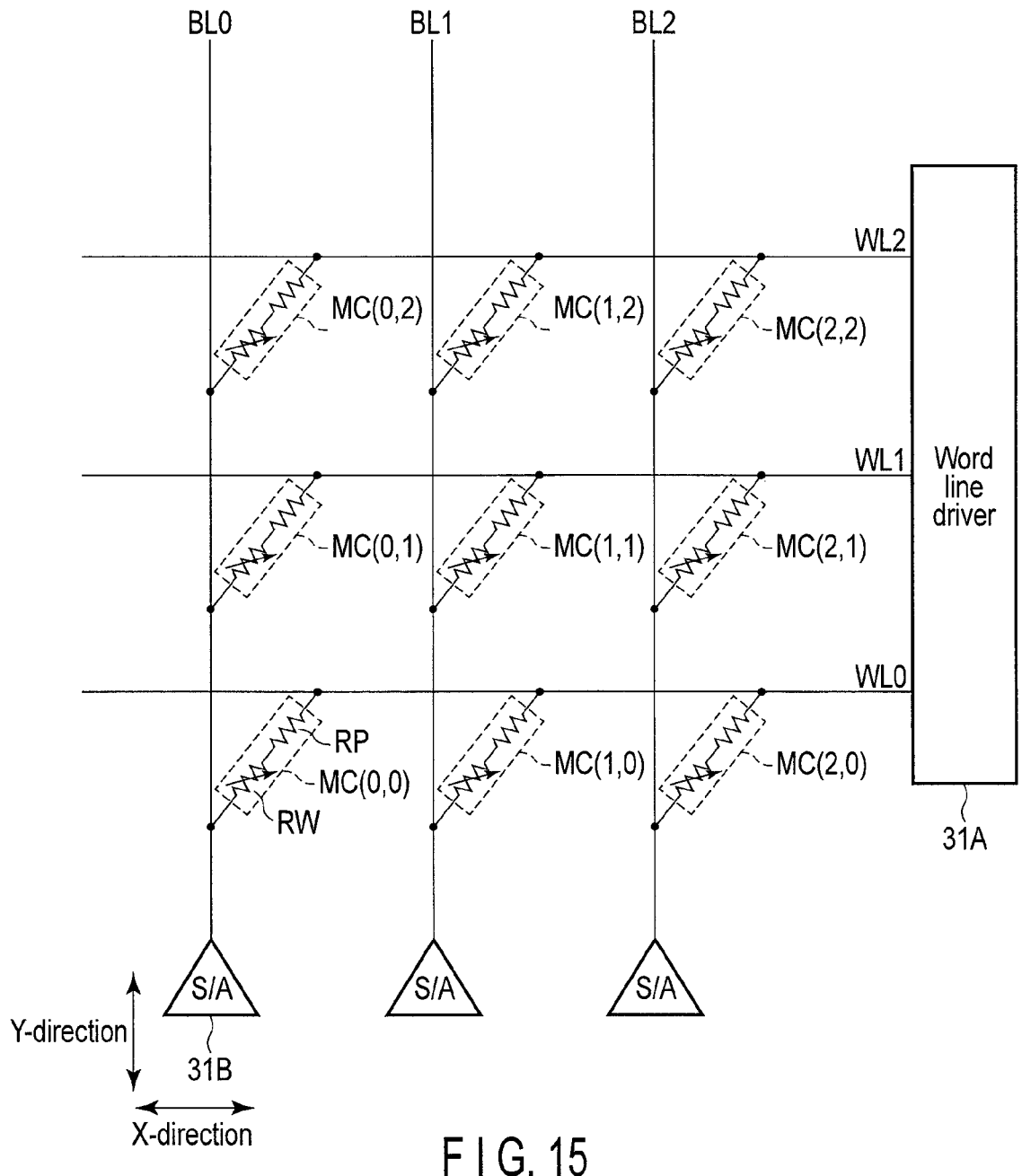

FIG. 15 is a circuit diagram showing a memory cell array in the resistance-change memory according to the second embodiment.

As shown, the memory cell array forms a cross-point type. Word lines WL0, WL1, and WL2 extend in an X-direction, and are arranged at predetermined intervals in a Y-direction. A word line driver 31A is connected to word lines WL0, WL1, and WL2. Bit lines BL0, BL1, and BL2 extend in the Y-direction, and are arranged at predetermined intervals in the X-direction. Sense amplifiers (S/A) 31B are connected to bit lines BL0, BL1, and BL2, respectively.

Memory cells MC (0,0), (0,1), . . . , (2,2) are disposed at the intersections of word lines WL0, WL1, and WL2 and bit lines BL0, BL1, and BL2, respectively. Thus, the resistance-change memory has a cross-point type memory cell array configuration. The memory cell MC has a resistance-change element RW and a protection resistive element RP. The resistance-change element RW and the protection resistive element RP are connected in series between the word line and the bit line. The protection resistive element RP is a current limiting resistance, and limits the lower limit of the resistance of the memory cell MC after writing.

The memory cell arrays shown in FIG. 15 may be stacked to form a stacked layer type memory cell array configuration.

[2] Memory Cell

FIG. 16 is a view showing the configuration of the memory cell MC shown in FIG. 15.

The memory cell MC includes a first electrode 11, a second electrode 12, a variable resistance layer 13 disposed between the first electrode 11 and the second electrode 12, and a protection resistive layer 14 disposed between the second electrode 12 and the variable resistance layer 13. The variable resistance layer 13 corresponds to the resistance-change element RW. The protection resistive layer 14 corresponds to the protection resistive element RP.

The variable resistance layer 13 has a filament 13A formed between the first electrode 11 and the protection resistive layer 14. The variable resistance layer 13 may have a single layer or a stacked layer structure (two or more layers).

The variable resistance layer 13 is shifted between a high-resistance state and a low-resistance state lower in resistance than the high-resistance state by at least one of a voltage and a current applied across the first electrode 11 and the second electrode 12. The length and thickness of the filament 13A in the low-resistance state are at least greater than the length and thickness of the filament 13A in the high-resistance state. Transitioning the variable resistance layer 13 from the high-resistance state to the low-resistance state is called setting or writing. Transitioning the variable resistance layer 13 from the low-resistance state to the high-resistance state is called resetting or erasing.

A control circuit 31 supplies a current to and applies a voltage across the first electrode 11 and the second electrode 12 to write, erase, and read. Here, the word line driver 31A and the sense amplifiers 31B in FIG. 15 are shown as the control circuit 31.

The following materials can be used for the protection resistive layer 14.

The protection resistive layer 14 includes at least one of materials selected from the group consisting of TaSiN, polycrystalline silicon (poly-Si), amorphous silicon (a-Si), silicon oxide ($SiO_2$), and silicon nitride (SiN).

The configuration including the variable resistance layer 13, the first electrode 11, and the second electrode 12 is similar in other respects to that according to the first embodiment described above.

[5] Advantageous Effects

The second embodiment has advantageous effects similar to those according to the first embodiment described above.

In the present embodiment, the memory cell having the resistance-change element and the protection resistive element connected in series is provided. If the resistance after writing is higher than a desired resistance, the memory cell is erased (reset), and then a higher upper limit of the limited current is set to again write.

For example, in FIG. 15, suppose that the current during the write is limited by the sense amplifiers 31B on the bit line side in order to write to selected memory cell MC (0,0). In this case, during the write, not only a current flows through selected memory cell MC (0,0) but also a leakage current flows through unselected memory cells MC (0,1) and MC (0,2).

Thus, in the first write, the limited current is set to a low first upper limit, and writing is performed. The currents that flow in the first write are the current that flows through selected memory cell MC (0,0) and the leakage current that flows through unselected memory cells MC (0,1) and MC (0,2). A combination of these currents is limited to the first upper limit.

If the resistance of selected memory cell MC (0,0) after the first write is higher than a desired resistance, the memory cell MC (0,0) is erased (reset). A limited current higher than the first upper limit is then set to again write. Such writing is repeated until the resistance of selected memory cell MC (0,0) is less than or equal to the desired resistance. As a result, the following advantageous effects are obtained.

When the current during writing is limited by the limited current of the bit line provided by the sense amplifier, this current limitation can only control the overall current including not only the on-current of the selected memory cell but also the leakage current that flows through the unselected memory cells. Therefore, when the on/off current ratio of the memory cell is low and the off-current has a greater influence, the on-current that flows through the selected memory cell during the write cannot be controlled, and the resistance of the memory cell after writing is uncontrollable. However, in the second embodiment, the protection resistive element RP connected in series to the resistance-change element RW is provided so that the resistance of the resistance-change element after writing can be controlled to be substantially equal to the resistance of the protection resistive element. For example, if the resistance of the protection resistive element RP is 100 MΩ, the resistance of the resistance-change element RW can be kept substantially equal to that 100 MΩ value.

The second embodiment allows the resistance to be controlled for each resistance-change element RW, and is therefore especially advantageous to, for example, simultaneous writing to a plurality of memory cells.

In the memory cell according to the first and second embodiments, for example, a selector or a diode may be provided as required. The memory cell according to the first and second embodiments can be used as a bipolar type or a unipolar type. In the case of the bipolar type, the polarities of voltage pulses applied to the memory cell during writing and erasing are reversed with respect to each other. In contrast, in the case of the unipolar type, the polarities of voltage pulses applied to the memory cells during writing and erasing are the same.

As described above, according to the first and second embodiments, it is possible to provide a resistance-change memory in which the filaments formed in the variable resistance layers of the memory cells in the low-resistance state can have uniform shape and in which variation in the resistance of the memory cells in the low-resistance state can be reduced.

For example, the method of applying the voltage pulse in FIG. 5 can be applied to the write voltage pulses shown in FIGS. 9, 11, 12, and 13.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance-change memory comprising:
a memory cell comprising a first electrode, a second electrode, and a variable resistance layer which is disposed between the first electrode and the second electrode and which is shifted between a high-resistance state and a low-resistance state lower in resistance than the high-resistance state; and
a control circuit which applies a voltage across the first electrode and the second electrode to change a resistance state of the memory cell, wherein the control circuit includes a current limiting circuit,
wherein the current limiting circuit in the control circuit performs a first operation to set a current flowing through the memory cell to a first upper limit having a first constant level to change the memory cell toward the low-resistance state,
wherein after the first operation, the current limiting circuit in the control circuit performs a second operation to check the resistance of the memory cell,
wherein after the second operation, if the resistance of the memory cell is higher than a predetermined value, the current limiting circuit in the control circuit performs a third operation to set the current flowing through the memory cell to a second upper limit which has a second constant level and which is higher than the first upper limit to change the memory cell toward the low-resistance state,
wherein the control circuit sets the current flowing through the memory cell to the first upper limit and then sets the current to a third upper limit in the first operation, and
wherein the control circuit applies a first voltage to the memory cell when set to the first upper limit, the control circuit applies a second voltage higher than the first voltage to the memory cell when set to the second upper limit, and the control circuit applies a third voltage higher than the first voltage and lower than the second voltage to the memory cell when set to the third upper limit.

2. The resistance-change memory according to claim 1, wherein the third upper limit is lower than the first upper limit.

3. A resistance-change memory comprising:
a memory cell comprising a first electrode, a second electrode, and a variable resistance layer which is disposed between the first electrode and the second electrode and which is shifted between a high-resistance state and a low-resistance state lower in resistance than the high-resistance state; and
a control circuit which applies a voltage across the first electrode and the second electrode to change a resistance state of the memory cell, wherein the control circuit includes a current limiting circuit,
wherein the current limiting circuit in the control circuit performs a first operation to set a current flowing through the memory cell to a first upper limit having a first constant level to change the memory cell toward the low-resistance state,
wherein after the first operation, the current limiting circuit in the control circuit performs a second operation to check the resistance of the memory cell,
wherein after the second operation, if the resistance of the memory cell is higher than a predetermined value, the current limiting circuit in the control circuit performs a third operation to set the current flowing through the memory cell to a second upper limit which has a second constant level and which is higher than the first upper limit to change the memory cell toward the low-resistance state,
wherein the control circuit sets the current flowing through the memory cell to the first upper limit and then sets the current to a third upper limit in the first operation, and
wherein the control circuit applies a first voltage to the memory cell when set to the first and second upper limits, and the control circuit applies a second voltage higher than the first voltage to the memory cell when set to the third upper limit.

4. A resistance-change memory comprising:
a memory cell comprising a first electrode, a second electrode, and a variable resistance layer which is disposed between the first electrode and the second electrode and which is shifted between a high-resistance state and a low-resistance state lower in resistance than the high-resistance state; and
a control circuit which applies a voltage across the first electrode and the second electrode to change a resistance state of the memory cell, wherein the control circuit includes a current limiting circuit,
wherein the current limiting circuit in the control circuit performs a first operation to set a current flowing through the memory cell to a first upper limit having a first constant level to change the memory cell toward the low-resistance state,
wherein after the first operation, the current limiting circuit in the control circuit performs a second operation to check the resistance of the memory cell,
wherein after the second operation, if the resistance of the memory cell is higher than a predetermined value, the current limiting circuit in the control circuit performs a third operation to set the current flowing through the memory cell to a second upper limit which has a second constant level and which is higher than the first upper limit to change the memory cell toward the low-resistance state,
wherein the control circuit sets the current flowing through the memory cell to the first upper limit and then sets the current to a third upper limit in the first operation, and
wherein the control circuit applies a first voltage to the memory cell when set to the first upper limit, the control circuit applies a second voltage higher than the first voltage to the memory cell when set to the second upper limit, and the control circuit applies a third voltage lower than the first voltage to the memory cell when set to the third upper limit.

5. A resistance-change memory comprising:
a memory cell comprising a first electrode, a second electrode, and a variable resistance layer which is disposed between the first electrode and the second electrode and which is shifted between a high-resistance state and a low-resistance state lower in resistance than the high-resistance state; and
a control circuit which applies a voltage across the first electrode and the second electrode to change a resistance state of the memory cell, wherein the control circuit includes a current limiting circuit,
wherein the current limiting circuit in the control circuit performs a first operation to set a current flowing through the memory cell to a first upper limit having a first constant level to change the memory cell toward the low-resistance state,
wherein after the first operation, the current limiting circuit in the control circuit performs a second operation to check the resistance of the memory cell,
wherein after the second operation, if the resistance of the memory cell is higher than a predetermined value, the current limiting circuit in the control circuit performs a third operation to set the current flowing through the memory cell to a second upper limit which has a second constant level and which is higher than the first upper limit to change the memory cell toward the low-resistance state,
wherein the control circuit sets the current flowing through the memory cell to the first upper limit and then sets the current to a third upper limit in the first operation, and
wherein the control circuit applies a first voltage to the memory cell when set to the first and second upper limits, and the control circuit applies a second voltage lower than the first voltage to the memory cell when set to the third upper limit.

6. The resistance-change memory according to claim 1, wherein the memory cell comprises a protection resistive layer disposed between the variable resistance layer and the second electrode.

7. The resistance-change memory according to claim 6, wherein the protection resistive layer includes at least one of materials selected from the group consisting of TaSiN, polycrystalline silicon, amorphous silicon, silicon oxide, and silicon nitride.

8. The resistance-change memory according to claim 1, wherein the first upper limit is constant at least during a period when the first voltage is applied to the memory cell in the first operation.

9. The resistance-change memory according to claim 3, wherein the third upper limit is lower than the first upper limit.

10. The resistance-change memory according to claim 3, wherein the memory cell comprises a protection resistive layer disposed between the variable resistance layer and the second electrode.

11. The resistance-change memory according to claim 10, wherein the protection resistive layer includes at least one of materials selected from the group consisting of TaSiN, polycrystalline silicon, amorphous silicon, silicon oxide, and silicon nitride.

12. The resistance-change memory according to claim 3, wherein the first upper limit is constant at least during a period when the first voltage is applied to the memory cell in the first operation.

13. The resistance-change memory according to claim 4, wherein the third upper limit is lower than the first upper limit.

14. The resistance-change memory according to claim 4, wherein the memory cell comprises a protection resistive layer disposed between the variable resistance layer and the second electrode.

15. The resistance-change memory according to claim 14, wherein the protection resistive layer includes at least one of materials selected from the group consisting of TaSiN, polycrystalline silicon, amorphous silicon, silicon oxide, and silicon nitride.

16. The resistance-change memory according to claim 4, wherein the first upper limit is constant at least during a period when the first voltage is applied to the memory cell in the first operation.

17. The resistance-change memory according to claim 5, wherein the third upper limit is lower than the first upper limit.

18. The resistance-change memory according to claim 5, wherein the memory cell comprises a protection resistive layer disposed between the variable resistance layer and the second electrode.

19. The resistance-change memory according to claim 18, wherein the protection resistive layer includes at least one of materials selected from the group consisting of TaSiN, polycrystalline silicon, amorphous silicon, silicon oxide, and silicon nitride.

20. The resistance-change memory according to claim 5, wherein the first upper limit is constant at least during a period when the first voltage is applied to the memory cell in the first operation.

* * * * *